(12) United States Patent
Miyamoto et al.

(10) Patent No.: US 7,393,757 B2
(45) Date of Patent: Jul. 1, 2008

(54) METHOD FOR SEPARATING SEMICONDUCTOR WAFER FROM SUPPORTING MEMBER, AND APPARATUS USING THE SAME

(75) Inventors: Saburo Miyamoto, Mie-ken (JP); Yukitoshi Hase, Mie-ken (JP)

(73) Assignee: Nitto Denko Corporation, Osaka (JP)

( * ) Notice: Subject to any disclaimer, the term of this patent is extended or adjusted under 35 U.S.C. 154(b) by 279 days.

(21) Appl. No.: 10/939,429

(22) Filed: Sep. 14, 2004

(65) Prior Publication Data
US 2005/0032332 A1    Feb. 10, 2005

(30) Foreign Application Priority Data
Oct. 6, 2003    (JP) .............................. 2003-347060

(51) Int. Cl.
*H01L 21/78* (2006.01)
(52) U.S. Cl. .................... 438/460; 438/460; 438/464
(58) Field of Classification Search ................. 438/455, 438/460, 458, 118, 106
See application file for complete search history.

(56) References Cited
U.S. PATENT DOCUMENTS 5,476,566 A * 12/1995 Cavasin ...................... 156/249
5,576,566 A * 11/1996 Kenney ........................ 257/301
6,627,037 B1 * 9/2003 Kurokawa et al. ........... 156/344
2001/0049256 A1    12/2001 Arai et al.

FOREIGN PATENT DOCUMENTS

| EA | 1 061 559 | 12/2000 |
| JP | 08023025 A * | 1/1996 |
| JP | 2001-007179 A1 | 1/2001 |
| WO | WO-03/001587 | 1/2003 |

OTHER PUBLICATIONS

European Search Report dated Sep. 6, 2006 for Application No. 04020711.0-2203.

* cited by examiner

*Primary Examiner*—Steven Loke
*Assistant Examiner*—Thinh T Nguyen
(74) *Attorney, Agent, or Firm*—Cheng Law Group PLLC

(57) ABSTRACT

A work is suction-held by an upper suction chuck stage from the surface side of a supporting member, is moved upward to a predetermined height, and is heated in a state where the thickness direction of a both-faced adhesive sheet is not restricted, and a dicing tape is cooled. After lapse of predetermined heating time, the work is separated from the both-faced adhesive sheet whose adhesive strength is weaken, and drops to a lower suction chuck stage.

4 Claims, 5 Drawing Sheets

METHOD FOR SEPARATING SEMICONDUCTOR WAFER FROM SUPPORTING MEMBER, AND APPARATUS USING THE SAME

BACKGROUND OF THE INVENTION (1) Field of the Invention

The present invention relates to a semiconductor wafer separating method for joining a dicing tape to a semiconductor wafer to which a supporting member is joined via a double-faced adhesive sheet, fixing the resultant to a dicing frame, and separating the semiconductor wafer integrally with the dicing frame from the supporting member, and to a separating apparatus used for the method.

(2) Description of the Related Art

In resent years, with rapid progress of an application, reduction in thickness of a semiconductor wafer to 100 μm to 50 μm, in some occasions, even to 25 μm is demanded. Such a thin semiconductor wafer is brittle and easily distorted and its handling is extremely difficult. Consequently, the semiconductor wafer is held by being joined to the surface side of a supporting member having strength such as a glass plate via a both-faced adhesive sheet. After the semiconductor wafer is reinforced by backing with the supporting member as described above, the back grind process is performed on the back face of the semiconductor wafer, and the semiconductor wafer is separated from the supporting member.

Hitherto, means for separating a semiconductor wafer held by being joined to a supporting member via a both-faced adhesive sheet is performed as follows. A both-faced adhesive sheet of an ultraviolet curing type whose adhesive strength is weakened by irradiation with an ultraviolet ray is used. First, by irradiation with ultraviolet rays, the adhesive strength is preliminarily decreased. In the subsequent process, the semiconductor wafer is sandwiched by upper and lower two tables and heated in a vacuumed state so as to be shrink-deformed, thereby reducing the contact area between the both-faced adhesive sheet and the semiconductor wafer, and the semiconductor wafer is floated.

After completion of the shrinking and separation of the both-faced adhesive sheet, suction of the upper table is cancelled and the upper table is withdrawn to the upper side. After that, in a state where the semiconductor wafer is suction-fixed on the lower table, a holding member is sucked and moved by a transport arm, thereby separating the semiconductor wafer from the both-faced adhesive sheet. Such means is proposed and carried out (see, for example, JP-A 2001-7179).

As the both-faced adhesive sheet used, not only a both-faced adhesive sheet of the ultraviolet curing type but also a both-faced adhesive sheet having heating separability which foams when heated and whose adhesive strength decreases are used.

The conventional means has the following problems.

In the case where a both-faced adhesive sheet has heating separability such that the sheet foams when being heated and its adhesive strength disappears, if a semiconductor wafer is restrained by being sandwiched by upper and lower two tables, foaming (expansion) of the both-faced adhesive sheet is disturbed and the adhesive strength cannot be sufficiently reduced. As a result, a problem occurs such that the semiconductor wafer cannot be smoothly separated from the supporting member.

For example, when the both-faced adhesive sheet whose adhesive strength has not disappeared is separated together with the supporting member from the semiconductor wafer, there is a possibility in that local separation stress acts on the semiconductor wafer and a warp or breakage may occur.

There is also a problem that an adhesive remains on the surface of semiconductor wafer.

SUMMARY OF THE INVENTION

The present invention is made in view of the above circumstances and its object is to provide a method and apparatus for separating a semiconductor wafer from a supporting member, capable of smoothly separating the semiconductor wafer integrally with a dicing frame from the supporting member without stress.

In order to achieve the above object, the present invention employs the following configuration:

A method for joining a dicing tape to a semiconductor wafer to which a supporting member is joined via a both-faced adhesive sheet, fixing the resultant to a dicing frame, and separating the semiconductor wafer integrally with the dicing frame from the supporting member, the method comprising the step of:

separating the semiconductor wafer integrally with the dicing frame from the supporting member while weakening adhesive strength of the both-faced adhesive sheet without restricting the both-faced adhesive sheet in the thickness direction.

According to this method, the adhesive strength is weakened in a state where the thickness direction of the both-faced adhesive sheet is not restricted, so that in a process of weakening the adhesive strength, stress such as a marginal pressure is not applied to the both-faced adhesive sheet. Therefore, the adhesive strength of the both-faced adhesive sheet can be efficiently weakened, and the adhesive strength can be sufficiently decreased. As a result, the semiconductor wafer and the dicing frame can be integrally smoothly separated from the supporting member without stress.

In the method according to the present invention, the semiconductor wafer and the dicing frame are lifted via the supporting member by holding the supporting member in a posture that the surface of the supporting member faces upward, and by weakening adhesive strength of the both-faced adhesive sheet in this state, the semiconductor wafer and the dicing frame are integrally separated from the supporting member by dead loads of the semiconductor wafer and the dicing frame.

According to this method, by weakening the adhesive strength of the both-faced adhesive sheet, the adhesive strength becomes weaker than the dead loads of the semiconductor wafer and the dicing frame, and the semiconductor wafer and the dicing frame that have been lifted are integrally separated from the supporting member. Therefore, the method according to the first aspect of the present invention can be carried out preferably.

In the method according to the present invention, the supporting member is held in a posture that the surface thereof faces upward, suction means is disposed close to the back face side of the semiconductor wafer and the dicing frame in a non-contact manner, and by weakening adhesive strength of the both-faced adhesive sheet and, also, sucking the dicing frame integrated with the semiconductor wafer, the semiconductor wafer and the dicing frame can be integrally separated from the supporting member.

According to this method, the semiconductor wafer and the dicing frame are sucked by the sucking means disposed close to the semiconductor wafer and the dicing frame in a non-contact manner in a state where the adhesive strength of the both-faced adhesive sheet is weakened, so that the semiconductor wafer and the dicing frame are positively separated from the supporting member. Therefore, the semiconductor wafer and the dicing frame can be integrally separated from the supporting member more efficiently.

In the method according to the present invention, the dicing frame is held, and while weakening adhesive strength of the both-faced adhesive sheet, the supporting member is sucked and separated by the suction means disposed close to the supporting member in a non-contact manner, thereby integrally separating the semiconductor wafer and the dicing frame from the supporting member.

According to this method, in a state where the back face sides of the semiconductor wafer and the dicing frame are held, the adhesive strength of the both-faced adhesive sheet is weakened and the supporting member is sucked by the sucking means in a non-contact manner. That is, since restriction in the thickness direction of the both-faced adhesive sheet is cancelled, stress such as pressure to the both-faced adhesive sheet is eliminated. While maintaining the state, the supporting member is separated. Therefore, the semiconductor wafer and the dicing frame can be integrally separated from the supporting member more efficiently.

As the both-faced adhesive sheet, it is preferable to use the following: a both-faced adhesive sheet whose adhesive strength is weakened by heating or cooling; and a both-faced adhesive sheet in which an adhesive layer having heating separability which foams and expands when being heated and loses adhesive strength is formed on one face of a sheet base material, and an ultraviolet curing adhesive layer is formed on the other face of the sheet base material.

In the case where the both-faced adhesive sheet is a both-faced adhesive sheet whose adhesive strength is weakened by heating, it is preferable to heat the both-faced adhesive sheet and, also, to cool the dicing tape. According to the method, by heating the both-faced adhesive sheet and, also, cooling the dicing tape, deformation of the dicing tape by heat and generation of gas caused by heating of the both-faced adhesive sheet can be prevented. Therefore, application of marginal stress to the both-faced adhesive sheet caused by deformation of the dicing tape and generation of gas can be avoided, and the semiconductor wafer and the dicing frame can be integrally separated from the supporting member more smoothly.

In order to achieve the above object, the present invention also employs the following configuration:

An apparatus for separating a semiconductor wafer from a supporting member integrally with a dicing frame of a work obtained by joining a dicing tape to the semiconductor wafer to which the supporting member is joined via a both-faced adhesive sheet and fixing the resultant to the dicing frame, the apparatus comprising:

the both-faced adhesive sheet whose adhesive strength is weakened by heating;

first holding means on which the work is mounted and held;

second holding means for holding the supporting member of the work mounted and held on the first holding means in a posture that the surface of the supporting member faces upward;

driving means for moving at least one of the first and second holding means in the vertical direction; and heating means for heating the both-faced adhesive sheet of the work held by the second holding means, wherein the first and second holding means are moved relative to each other by the driving means in a state where the work is held by the second holding means to make the work apart from the first holding means, and by weakening adhesive strength of the both-faced adhesive sheet in this state, the semiconductor wafer and the dicing frame are integrally separated from the supporting member by their dead loads.

According to this apparatus, the both-faced adhesive sheet whose adhesive strength is weakened by heating is used. In this apparatus, the work mounted and held on the first holding means is held by the second holding means in a posture that the supporting member faces upward. The first and second holding means are moved relative to each other in this state by the driving means, and the work is apart from the first holding means. In other words, the back face side of the work is open and the thickness direction of the both-faced adhesive sheet is not restricted. The both-faced adhesive sheet is heated by the heating means in this state. Therefore, the adhesive strength of the heated both-faced adhesive sheet is weakened, the semiconductor wafer and the dicing frame are integrally separated from the supporting member by their dead loads, drop, and are held by the first holding means. In such a manner, the method according to the first aspect of the present invention can be preferably realized.

Preferably, the apparatus of the present invention further comprises sucking means for sucking the work held by the second holding means from below at the time of heating the both-faced adhesive sheet.

According to this apparatus, by providing the sucking means for sucking the work, in a state where the adhesive strength of the both-faced adhesive sheet is weakened, the semiconductor wafer and the dicing frame can be integrally positively separated.

Preferably, the apparatus of the present invention further comprises cooling means for cooling the dicing tape. Specifically, by heating the both-faced adhesive sheet and, also, cooling the dicing tape, deformation of the dicing tape and generation of gas due to heat at the time of heating the both-faced adhesive sheet can be prevented.

In order to achieve the above object, the present invention also employs the following configuration:

An apparatus for separating a semiconductor wafer from a supporting member integrally with a dicing frame of a work obtained by joining a dicing tape to the semiconductor wafer to which the supporting member is joined via a both-faced adhesive sheet and fixing the resultant to the dicing frame, the apparatus comprising:

the both-faced adhesive sheet whose adhesive strength is weakened by heating;

third holding means on which the work is mounted and which suction-holds the work;

heating means for heating the both-faced adhesive sheet of the work held by the third holding means; and sucking means for sucking the supporting member of the work, wherein the both-faced adhesive sheet is heated to weaken its adhesive strength, and the sucking means is moved close to the supporting member in a non-contact manner and sucks the supporting member, thereby integrally separating the semiconductor wafer and the dicing frame from the supporting member.

According to this apparatus, the both-faced adhesive sheet whose adhesive strength is weakened by heating is used. In this apparatus, the work mounted on the third holding means is held in a state where the top is open. That is, the both-faced adhesive sheet is heated by the heating means without restricting the thickness direction of the both-faced adhesive sheet. At this time, the supporting member is separated by the sucking means close to the supporting member in a non-contact manner. For example, a configuration may be employed such that a differential pressure from the atmospheric atmosphere is generated in a gap between the separating means and the supporting member by suction of the sucking means or gas ejected from the surface side of the supporting member, and the supporting member is suspension-held in a space maintaining predetermined distance.

Preferably, the apparatus of the present invention further comprises cooling means for cooling the dicing tape. To be specific, by heating the both-faced adhesive sheet and, also, cooling the dicing tape, deformation of the dicing tape and generation of gas caused by heat at the time of heating the both-faced adhesive sheet can be prevented.

In order to achieve the above object, the present invention also employs the following configuration:

An apparatus for separating a semiconductor wafer from a supporting member integrally with a dicing frame of a work obtained by joining a dicing tape to the semiconductor wafer to which the supporting member is joined via a both-faced adhesive sheet and fixing the resultant to the dicing frame, the apparatus comprising:

the both-faced adhesive sheet whose adhesive strength is weakened by cooling;

first holding means on which the work is mounted and held;

second holding means for holding the supporting member of the work mounted and held on the first holding means in a posture that the surface of the supporting member faces upward;

driving means for moving at least one of the first and second holding means in the vertical direction; and cooling means for cooling the both-faced adhesive sheet of the work held by the second holding means, wherein the first and second holding means are moved relative to each other by the driving means in a state where the work is held by the second holding means to make the work apart from the first holding means, and by weakening adhesive strength of the both-faced adhesive sheet in this state, the semiconductor wafer and the dicing frame are integrally separated from the supporting member by their dead loads.

According to this apparatus, the both-faced adhesive sheet whose adhesive strength is weakened by heating is used. In this apparatus, the work mounted and held on the first holding means is held in a posture that the supporting member faces upward by the second holding means. In this state, the first and second holding means are moved relative to each other by the driving means, and the work is apart from the first holding means. In other words, the back face side of the work is open and the thickness direction of the both-faced adhesive sheet is not restricted. In this state, the both-faced adhesive sheet is cooled by the cooling means. Therefore, the adhesive strength of the cooled both-faced adhesive sheet is weakened, the semiconductor wafer and the dicing frame are integrally separated from the supporting member by their dead loads, drop, and are held by the first holding means. In such a manner, the method according to the first aspect of the present invention can be preferably realized.

In order to achieve the above object, the present invention also employs the following configuration:

An apparatus for separating a semiconductor wafer from a supporting member integrally with a dicing frame of a work obtained by joining a dicing tape to the semiconductor wafer to which the supporting member is joined via a both-faced adhesive sheet and fixing the resultant to the dicing frame, the apparatus comprising:

the both-faced adhesive sheet whose adhesive strength is weakened by cooling;

third holding means on which the work is mounted and which suction-holds the work;

cooling means for cooling the both-faced adhesive sheet of the work held by the third holding means; and sucking means for sucking the supporting member of the work, wherein the both-faced adhesive sheet is cooled to weaken its adhesive strength, and the sucking means is moved close to the supporting member in a non-contact manner and sucks the supporting member, thereby integrally separating the semiconductor wafer and the dicing frame from the supporting member.

According to this apparatus, the both-faced adhesive sheet whose adhesive strength is weakened by cooling is used. In this apparatus, the work mounted on the third holding means is held in a state where the top is open. That is, the both-faced adhesive sheet is cooled by the cooling means without restricting the thickness direction of the both-faced adhesive sheet. At this time, the supporting member is separated by the sucking means close to the supporting member in a non-contact manner. For example, a configuration may be employed such that a differential pressure from the atmospheric atmosphere is generated in a gap between the separating means and the supporting member by suction of the sucking means or gas ejected from the surface side of the supporting member, and the supporting member is suspension-held in a space maintaining predetermined distance.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Embodiments of the present invention will be described below with reference to the drawings.

First Embodiment

Figure 1:
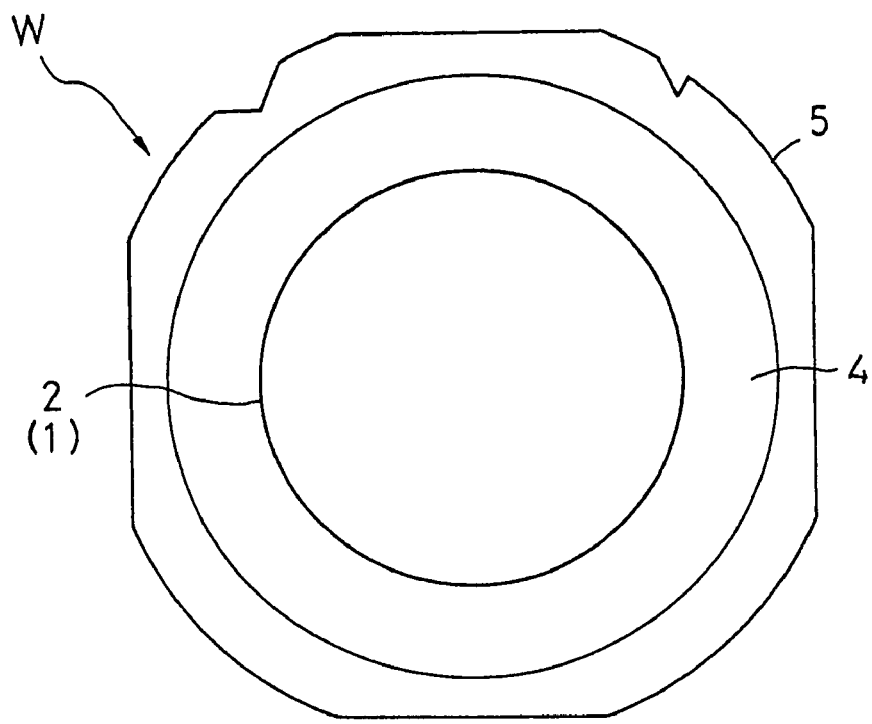
FIG. 1 is a plan view of a work wherein a semiconductor wafer is fixed by being joined to a dicing frame.
Figure 2:
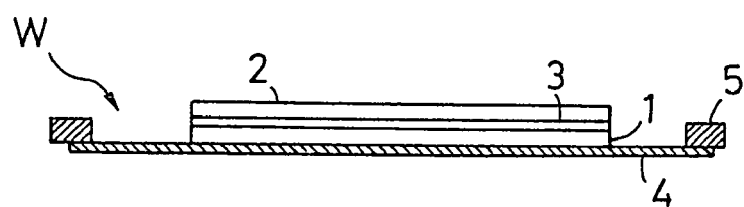
FIG. 2 is a vertical cross sectional view of the work.
Figure 3:
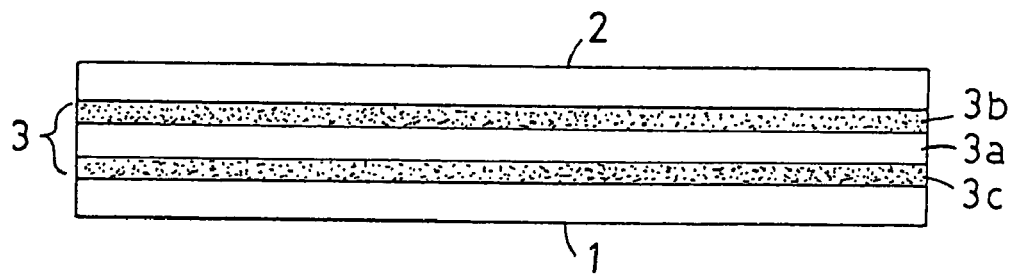
FIG. 3 is a side view of a semiconductor wafer to which a supporting member is joined.

FIG. 1 is a plan view of a work W obtained by joining and fixing a semiconductor wafer 1 to which a supporting member 2 taking the form of a glass plate is joined via a both-faced adhesive sheet to a dicing frame 5 via a dicing tape 4. FIG. 2 is a vertical cross sectional view of the work W. FIG. 3 is a side view of the semiconductor wafer 1 to which the supporting member 2 is joined via a both-faced adhesive sheet 3.

As shown in FIG. 2, the supporting member 2 is joined to a device formation face (surface) of the semiconductor wafer 1 via the both-faced adhesive sheet 3. In a state where the back face of the semiconductor wafer 1 is backing-reinforced by the supporting member 2, the back face of the semiconductor wafer 1 is ground to a desired thickness in a back grinding process. After that, the semiconductor wafer 1 is joined and fixed to the ring-shaped dicing frame 5 via the dicing tape 4, and loaded into a dicing apparatus.

Herein, the both-faced adhesive sheet 3 is constructed by, as shown in FIG. 3, providing an adhesive layer 3b having heating separability which foams and expands when being heated and loses its adhesive strength and an ultraviolet curing adhesive layer 3c on both sides of a sheet base material 3a. The supporting member 2 is joined to the adhesive layer 3b having heating separability, and the semiconductor wafer 1 is joined to the ultraviolet curing adhesive layer 3c.

Before the work W constructed as described above is loaded into the dicing apparatus, the semiconductor wafer 1 integrated with the dicing frame 5 has to be separated from the supporting member 2. The separating process will be described with reference to FIGS. 4 to 6.

Figure 4:
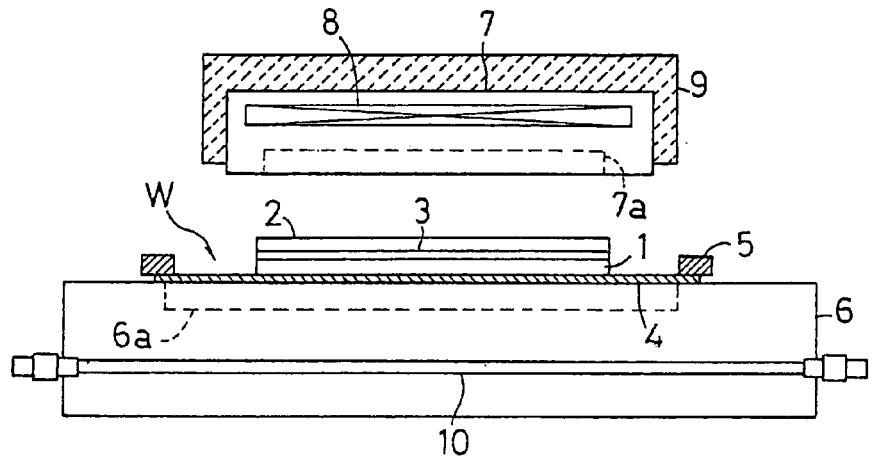
FIGS. 4 to 7 are side views each illustrating a separating process performed by separating means of a first embodiment.

As shown in FIG. 4, first, the work W is loaded onto a lower suction chuck stage 6 in a posture that the rear face (non-adhesive face) of the dicing tape 4 faces downward, and is suction-held by the top face of the lower suction chuck stage 6 via a vacuum suction part 6a. The lower suction chuck stage 6 corresponds to first holding means of the present invention.

Above the lower suction chuck stage 6, an upper suction chuck stage 7 which is moved in the vertical direction via driving means (not shown) waits. A vacuum suction part 7a is provided in the under face of the upper suction chuck stage 7. A heater 8 is buried in the upper suction chuck stage 7. The upper suction chuck stage 7 is covered with a heat insulating material 9, thereby suppressing dissipation of heat from the parts other than the under face, so that the upper suction chuck stage 7 heated to a predetermined temperature does not descend. The upper suction chuck stage 7 corresponds to second holding means of the present invention. The heater 8 corresponds to heating means of the present invention.

Figure 5:
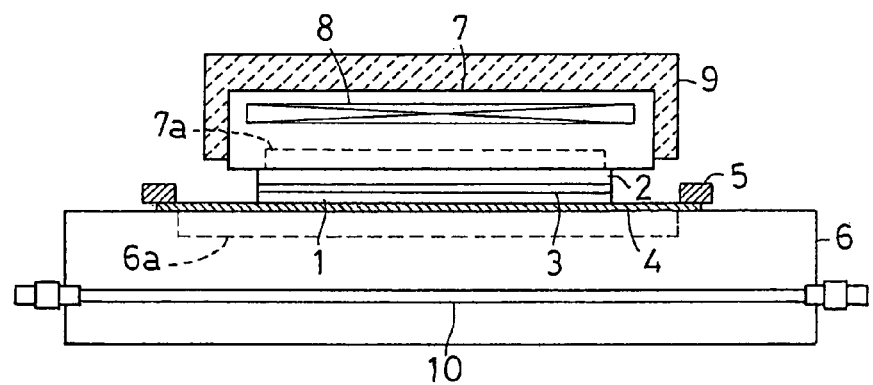
Figure 6:
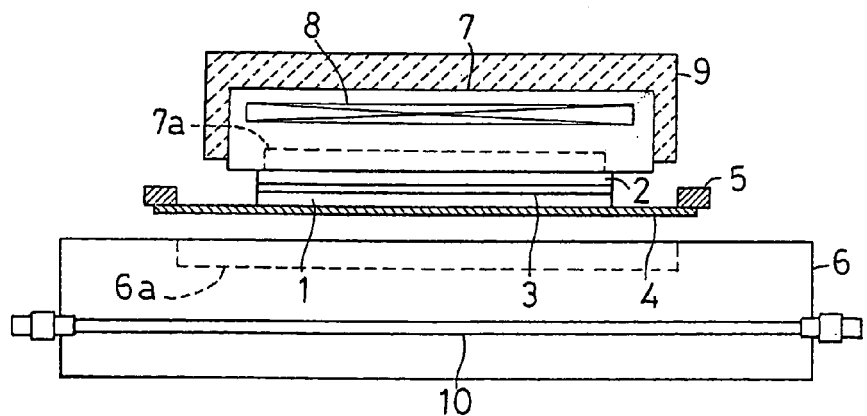

As shown in FIG. 5, the upper suction chuck stage 7 is moved downward so as to suction-hold the top face of the supporting member 2 of the work W. When the supporting member 2 is suction-held by the upper suction chuck stage 7, suction of the lower suction chuck stage 6 is cancelled. Simultaneously, as shown in FIG. 6, the upper suction chuck stage 7 in a state where the work W is suction-held is moved upward and is stopped at a height with a small distance from the lower suction chuck stage 6, and the both-faced adhesive sheet 3 is heated via the supporting member 2.

It is preferable that a press load lie in a set range (for example, about 500 g to 1000 g) by using a balance spring or balance weight so that an excessive force is not applied to the work W when the upper suction chuck stage 7 suction-holds the work W.

In the case where the dicing tape 4 having low heat resistance is used, preferably, a cooling fluid (gas or liquid) is circulated in a cooling passage 10 formed inside the lower suction chuck stage 6 to prevent the dicing tape 4 from being thermal deformed by heat from the upper suction chuck stage 7 or prevent generation of gas. The cooling passage 10 corresponds to cooling means of the present invention.

Figure 7:
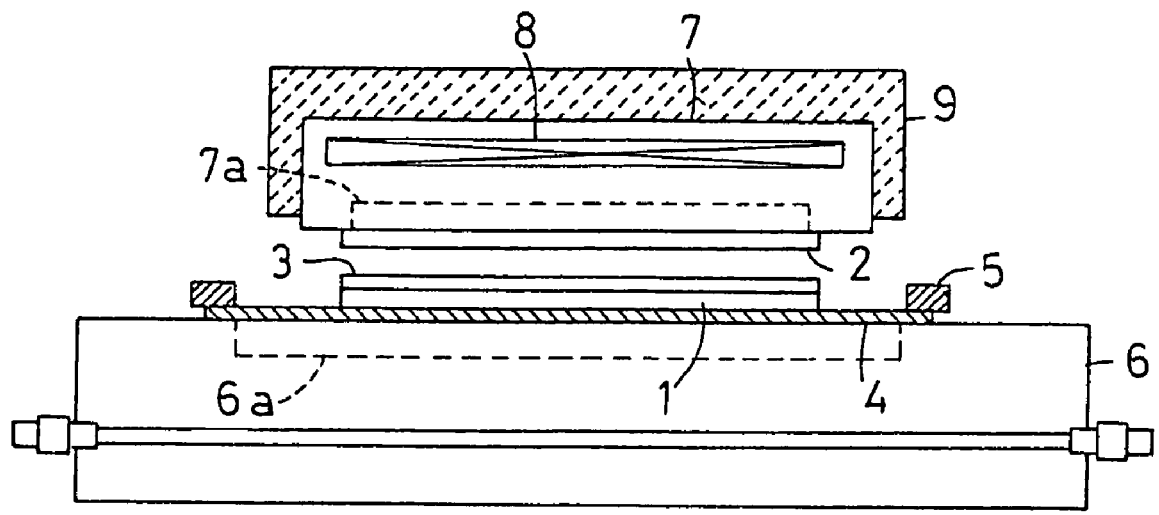

After lapse of predetermined time of heating by the upper suction chuck stage 7, adhesive strength of the adhesive layer 3b having heating separability in the both-faced adhesive sheet 3 largely drops or almost disappears by heating. Consequently, as shown in FIG. 7, the semiconductor wafer 1 to which the both-faced adhesive sheet 3 is joined is separated and drops from the supporting member 2 integrally with the dicing frame 5 by its dead load. In order to prevent breakage of the semiconductor wafer 1 by a drop impact, proper head is about 0.1 mm to 1.0 mm.

On the device formation face of the semiconductor wafer 1 separated from the supporting member 2 integrally with the dicing frame 5 in such a manner, the both-faced adhesive sheet 3 having the function of a protection sheet remains. Therefore, prior to an actual dicing process, the adhesive strength of the adhesive layer 3c is weakened by irradiation with ultraviolet rays and, after that, the both-faced adhesive sheet 3 is separated and removed by using a surface protection sheet separating mechanism as conventional means.

For example, a surface protection sheet separating mechanism joins a separating tape on the surface of the both-faced adhesive sheet remained on the surface of the semiconductor wafer 1 via a separating bar or separating roller, and separates the both-faced adhesive sheet integrally with the separating tape.

With the above configuration, the upper suction chuck stage 7 is moved upward in a state where the work W is suction-held, and is stopped at a height with a small distance from the lower suction chuck stage 6. Consequently, when the both-faced adhesive sheet 3 is heated, the both-faced adhesive sheet 3 is not restricted in its thickness direction. To be specific, nothing disturbs foaming and thermal expansion of the adhesive layer 3b having heating separability which is made by heating, so that the adhesive strength can be made sufficiently disappear. As a result, the semiconductor wafer 1 and the dicing frame 5 can be integrally smoothly separated without stress.

By cooling the under face of the dicing tape 4, thermal deformation of the dicing tape 4 and generation of gas can be efficiently prevented.

Second Embodiment

In a second embodiment, a case where both ends of the dicing frame 5 are mounted on the top ends of lower holding members such as plate materials, transport belts, or the like will be described as an example.

Figure 9:
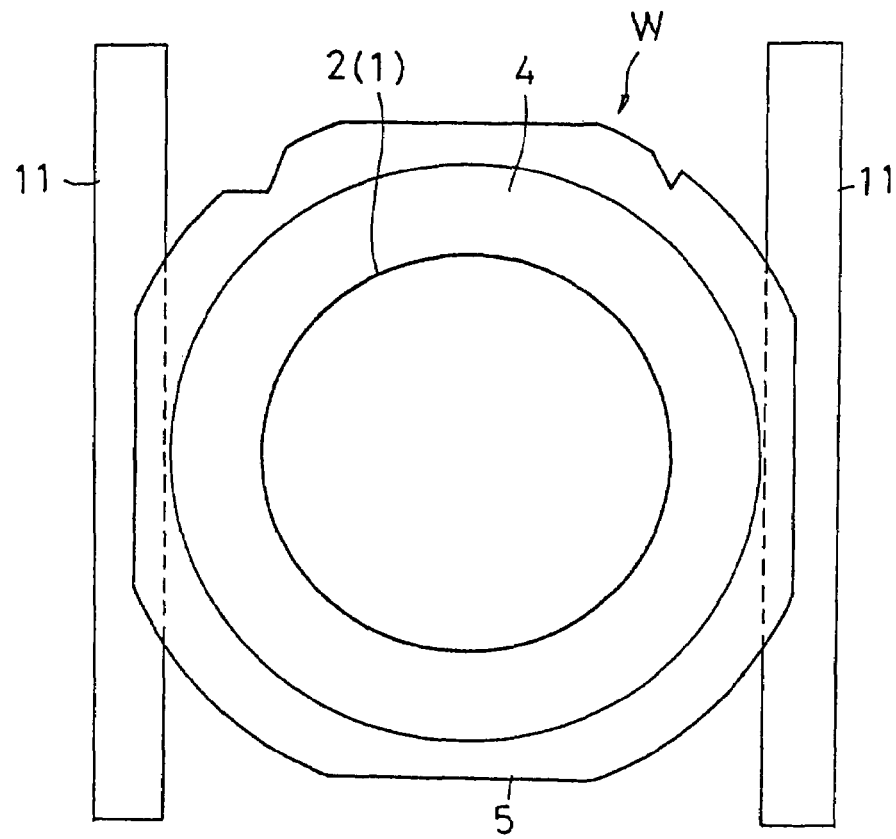
FIG. 9 is a plan view showing a state where a work of a second embodiment is mounted.

FIG. 9 is a plan view showing a state where a work is mounted and held, and FIGS. 10 to 13 are side views each illustrating a separating process performed by separating means.

As shown in FIG. 9, a work W is loaded so that both ends of the dicing frame 5 are mounted on the top ends of lower holding members 11 such as plate materials, transport belts, or the like. A cooling stage 12 is disposed between the lower holding members 11. The lower holding member 11 corresponds to first holding means of the present invention, and the cooling stage 12 corresponds to cooling means.

A cooling device 13 is buried in the cooling stage 12, and a cooling air injection part 14 is provided on the top face of the cooling stage 12. By blowing cooling air to the under face of the dicing tape 4, thermal deformation of the dicing tape 4 or generation of gas is prevented.

Then, the semiconductor wafer 1 integrated with the dicing frame 5 is separated from the supporting member 2. The separating process will be described with reference to FIGS. 10 to 13.

Figure 10:
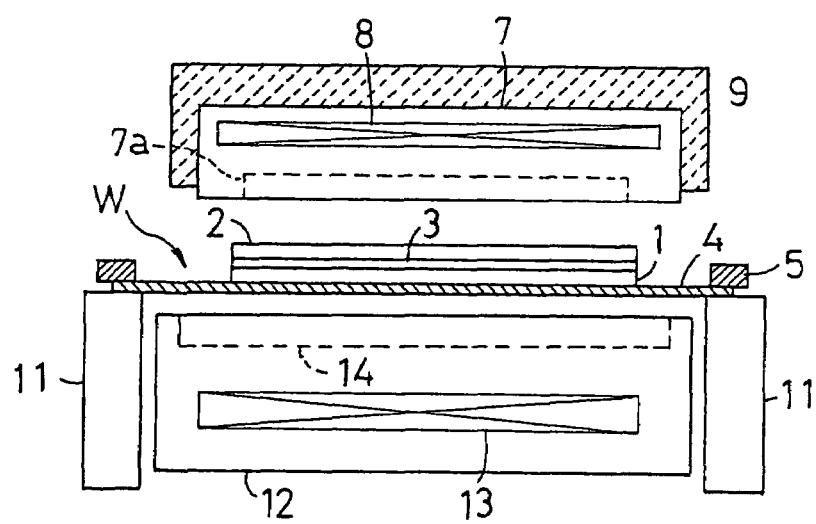
FIGS. 10 to 13 are side views each illustrating a separating process performed by separating means of the second embodiment.
Figure 11:
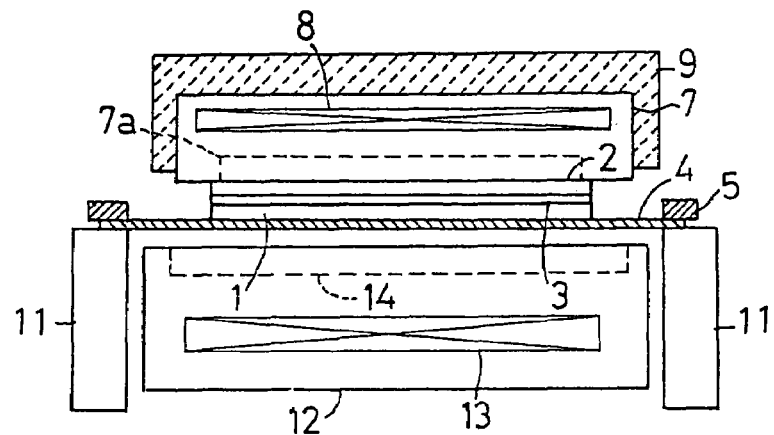

As shown in FIG. 10, the work W mounted on the lower holding members 11 is loaded. Subsequently, as shown in FIG. 11, the upper suction chuck stage 7 of the work W moves downward and suction-holds the surface of the supporting member 2.

Figure 12:
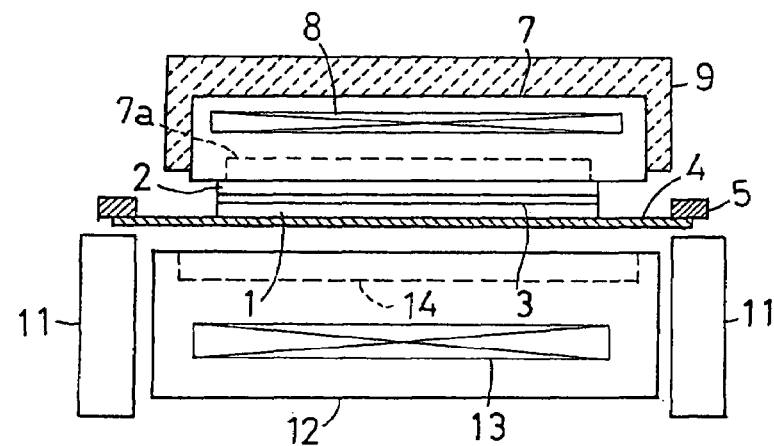
Figure 13:
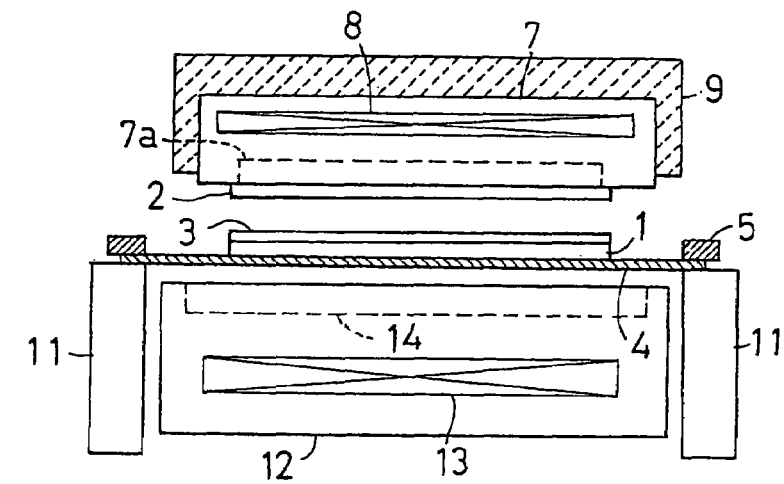

On completion of suction-holding of the supporting member 2, as shown in FIG. 12, the upper suction chuck stage 7 in a state where the work W is suction-held is moved upward and, then, is stopped at a predetermined height, and heating of the both-faced adhesive sheet 3 by the heater 8 via the supporting member 2 starts. At this time, cooling air is blown from the cooling stage 12 disposed blow the work W toward the back face of the dicing tape 4, thereby starting cooling.

After lapse of predetermined time of heating of the both-faced adhesive sheet 3, adhesive strength of the adhesive layer 3b is weakened or almost disappears, and the work W drops to the lower holding members in a state where the sheet base material 3a remains. The series of separating processes are finished.

With the configuration described above, when the both-faced adhesive sheet 3 is heated without restricting the both-faced adhesive sheet 3 in its thickness direction to let the adhesive layer 3b having heating separability foam, so that the adhesive strength can be made sufficiently disappear. As a result, the semiconductor wafer 1 and the dicing frame 5 can be integrally smoothly separated from the supporting member 2 without stress.

By blowing the cooling air to the under face of the dicing tape 4, thermal deformation of the dicing tape 4 can be efficiently prevented. Further, when the lower holding members 11 are transport belts, the work W can be transported as it is to the subsequent process, so that the work efficiency can be also improved.

The present invention can be also modified as follows.

(1) In each of the foregoing embodiments, as the adhesive layer 3c on the wafer side in the both-faced adhesive sheet 3, an adhesive layer having heating separability like the adhesive layer 3b on the supporting member side can be used. In this case, it is necessary to select the adhesive layer 3c on the wafer side whose adhesive strength is lost at a temperature higher than that of the adhesive layer 3b on the supporting member side.

(2) Each of the foregoing embodiments can be also carried out on assumption that the adhesive strength of the adhesive layers 3b and 3c in the both-faced adhesive sheet 3 is weakened by cooling.

(3) In the first embodiment, the lower suction chuck stage 6 is movable in the vertical direction. In a state where the supporting member 2 is suction-held by the upper suction chuck stage 7 that has been moved downward, the lower suction chuck stage 6 at which suction is cancelled may be moved downward by a predetermined distance and allowed to perform a separating operation similar to the above.

Figure 8:
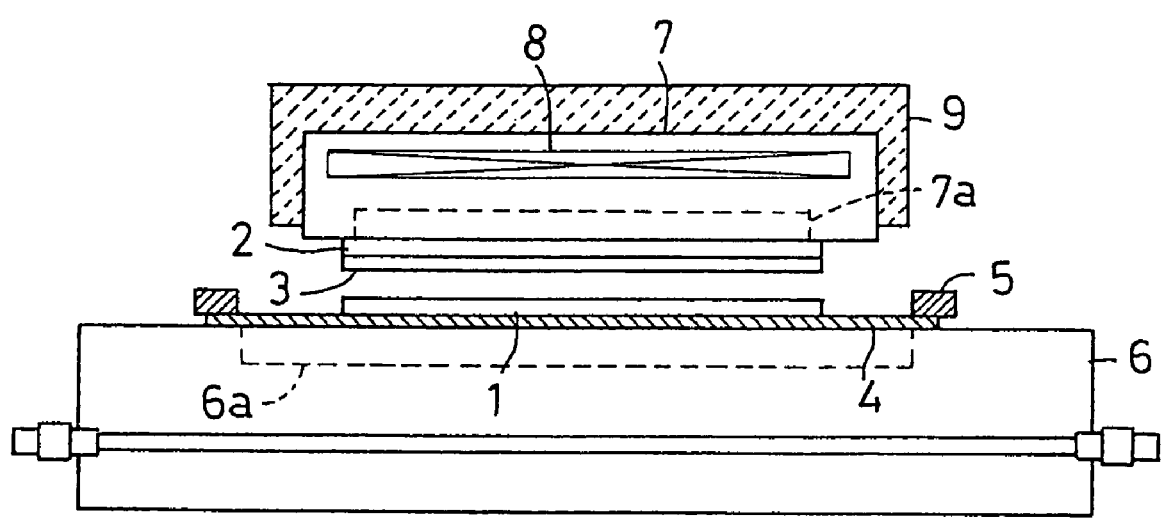
FIG. 8 is a side view illustrating a separating process performed by a modification of the separating means of the first embodiment.

(4) When the semiconductor wafer 1 and the dicing frame 5 are integrally separated, as shown in FIG. 8, the both-faced adhesive sheet 3 may remain on the supporting member 2 side. In this case, it is sufficient to use adhesive layers having heating separability as the adhesive layers 3b and 3c and, also, to make the adhesive layer 3c on the wafer side foam at a temperature lower than a temperature at which the adhesive layer 3b on the supporting member side foams to thereby lose the adhesive strength.

(5) Although the semiconductor wafer 1 and the dicing frame 5 drop and are separated by the dead load in the foregoing embodiments, it is also possible to dispose suction means below the dicing frame 5 to positively suck the work W, thereby separating the work W while heating the both-faced adhesive sheet 3.

(6) Although the semiconductor wafer 1 and the dicing frame 5 drop and are separated by the dead load in the foregoing embodiments, the following configurations may be also employed.

With respect to the work W suction-held by the lower suction chuck stage 7 in which the heater 8 is buried, while weakening the adhesive strength by heating the both-faced adhesive sheet 3, the supporting member 2 may be floated and separated. For example, suction means may be moved to a position above and close to the supporting member 2 to make the supporting member 2 float. As another configuration, the differential pressure from the atmospheric pressure is generated in a gap between the lower suction chuck stage 7 and the supporting member 2 by gas ejected from the surface side of the supporting member 2, and the supporting member 2 is suspension-held in a space maintaining a predetermined distance. With the configurations as well, effects similar to those of the foregoing embodiments can be exhibited. The lower suction chuck stage 7 in this case corresponds to third holding means of the present invention.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for joining a dicing tape to a semiconductor wafer to which a supporting member is joined via a both-faced adhesive sheet, fixing the resultant to a dicing frame, and separating the semiconductor wafer integrally with the dicing frame from the supporting member, the method comprising the step of:

separating the semiconductor wafer integrally with the dicing frame from the supporting member while weakening adhesive strength of the both-faced adhesive sheet without restricting the both faced adhesive sheet in the thickness direction, wherein in the step, the semiconductor wafer and the dicing frame are lifted via the supporting member by holding the supporting member in a posture that the surface of the supporting member faces upward, and by weakening adhesive strength of the both-faced adhesive sheet in this state, the semiconductor wafer and the dicing frame are integrally separated from the supporting member by dead loads of the semiconductor wafer and the dicing frame.

2. The method according to claim 1, further comprising:

suction means is disposed close to the back face side of the semiconductor wafer and the dicing frame in a non-contact manner.

3. The method according to claim 2 wherein in the both-faced adhesive sheet, an adhesive layer having heating separability which foams and expands when being heated and loses its adhesive strength is formed on one face of a sheet base material, and an ultraviolet curing adhesive layer is formed on the other face of the sheet base material.

4. A method for joining a dicing tape to a semiconductor wafer to which a supporting member is joined via a both-faced adhesive sheet, fixing the semiconductor wafer, both-faced adhesive sheet and the supporting member to a dicing frame, and separating the semiconductor wafer integrally with the dicing frame from the supporting member, the method comprising the step of:

separating the semiconductor wafer integrally with the dicing frame from the supporting member while weakening adhesive strength of the both-faced adhesive sheet without restricting the both-faced adhesive sheet in the thickness direction, wherein in the separating step, the both-face adhesive sheet is heated, and the dicing tape is cooled by cooling air, the adhesive strength of the both-faced adhesive sheet is weakened by heating.

* * * * *